United States Patent
Tanaka et al.

(10) Patent No.: US 9,172,226 B2
(45) Date of Patent: Oct. 27, 2015

(54) MULTI-CORE CABLE AND ALIGNING METHOD THEREFOR

(71) Applicant: SUMITOMO ELECTRIC INDUSTRIES, LTD., Osaka-shi, Osaka (JP)

(72) Inventors: Masato Tanaka, Kanuma (JP); Yoshimasa Watanabe, Kanuma (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 131 days.

(21) Appl. No.: 13/905,493

(22) Filed: May 30, 2013

(65) Prior Publication Data

US 2013/0333943 A1    Dec. 19, 2013

(30) Foreign Application Priority Data

Jun. 4, 2012  (JP) .................................. 2012-127022

(51) Int. Cl.
*H02G 3/02* (2006.01)
*H05K 13/00* (2006.01)
*H01R 9/03* (2006.01)

(52) U.S. Cl.
CPC ................. *H02G 3/02* (2013.01); *H01R 9/038* (2013.01); *H05K 13/00* (2013.01); *Y10T 156/1062* (2015.01)

(58) Field of Classification Search
CPC ............. H02G 3/02; H01R 9/038; H01R 9/05
USPC .............. 174/68.1, 250, 251, 255, 258, 70 R, 174/72 R, 74 R, 75 R, 75 C, 76, 84 R, 85, 174/88 R, 88 C, 88 S, 89, 90, 94 R, 70 C, 98, 174/102 R, 103, 110 R, 113 R, 71 C; 439/578–581, 874, 876; 156/256
See application file for complete search history.

(56) References Cited

U.S. PATENT DOCUMENTS

| | | | | |
|---|---|---|---|---|
| 5,347,711 A | * | 9/1994 | Wheatcraft et al. | ............ 29/843 |
| 5,815,916 A | * | 10/1998 | Luc | ................................. 29/828 |
| 7,271,340 B2 | * | 9/2007 | Buck et al. | .................. 174/75 C |
| 8,878,062 B2 | * | 11/2014 | Tanaka et al. | ................ 174/71 C |

FOREIGN PATENT DOCUMENTS

JP    2011-090870 A    5/2011

* cited by examiner

*Primary Examiner* — Angel R Estrada
*Assistant Examiner* — Dimary Lopez Cruz
(74) *Attorney, Agent, or Firm* — Global IP Counselors, LLP

(57) ABSTRACT

One aspect of the invention relates to a multi-core cable in which a cable sheath covers plural electronic wires in each of which a central conductor is covered with a covering. In the multi-core cable, the electronic wires are exposed from a longitudinal end of the cable sheath, and distal ends of exposed portions of the plural electronic wires are parallel aligned, and the exposed portions of the plural electronic wires are fixed by a resin in a place within a range from the end of the cable sheath to a parallel aligned place.

19 Claims, 7 Drawing Sheets

MULTI-CORE CABLE AND ALIGNING METHOD THEREFOR

CROSS-REFERENCE TO RELATED APPLICATIONS

This application claims priority from Japanese Patent Application No. 2012-127022 filed on Jun. 4, 2012, the entire contents of which are incorporated herein by reference.

TECHNICAL FIELD

The present invention relates to a multi-core cable connected to a connecting member such as a substrate, and an aligning method for the multi-core cable.

BACKGROUND ART

The distal end of a multi-core cable is connected to a substrate by soldering in a state in which each electronic wire is aligned after each electronic wire is exposed by removing a sheath.

DISCLOSURE OF THE INVENTION

For a multi-core cable, it may be required that a size from a sheath cut portion to a substrate is shortened to, for example, about 2 to 3 mm to thereby minimize an exposed length of the cable (for example, see JP-2011-090870-A). For such a case, although a method of sticking a tape on an exposed portion of an electronic wire to maintain a wire aligned state and then connecting the electronic wire to the substrate by soldering may be used, in some cases, the exposed length of the electronic wire exposed from the multi-core cable may be short, and thus, the wire aligned state could not be held only by an adhesive force of the tape.

One aspect of the invention is to provide a multi-core cable for facilitating attachment of an electronic wire to a substrate and holding a wire aligned state even when a length of a fixed place is short.

According to one aspect of the invention, there is provided a multi-core cable in which a cable sheath covers plural electronic wires in each of which a central conductor is covered with a covering, wherein the electronic wires are exposed from a longitudinal end of the cable sheath, wherein distal ends of exposed portions of the plural electronic wires are parallel aligned, and wherein the exposed portions of the plural electronic wires are fixed by a resin in a place within a range from the end of the cable sheath to a parallel aligned place.

In the multi-core cable, each of the electronic wires may be a coaxial wire which includes:

the central conductor;

an external conductor arranged outside the central conductor; and the covering.

In the multi-core cable, wherein each of the electronic wires may be an insulated wire.

In the multi-core cable, a coaxial wire and an insulated wire may be mixed as the plural electronic wires.

In the multi-core cable, the external conductors of the coaxial wires may be mutually coupled and fixed by solder.

In the multi-core cable, wherein the plural electronic wires may be divided into plural groups such that the distal ends of the electronic wires are parallel aligned at a predetermined pitch in an every group and such that the electronic wires are fixed by a resin in an every group.

In the multi-core cable, a distance between the end of the cable sheath and an end of a resin fixed place at a distal end side of the electronic wire may be set at 10 mm or less, and a length of the fixed place along a longitudinal direction of the coaxial cable may be set at 4 to 10 mm.

Another aspect of the invention provides an aligning method for a multi-core cable.

According to another aspect of the invention, there is provided an aligning method for a multi-core cable including: plural electronic wires in each of which a central conductor is covered with a covering; and a cable sheath which covers the electronic wires, the method including:

an electronic wire exposing step of removing the cable sheath at an end of the multi-core cable and exposing the plural electronic wires, an aligning step of parallel aligning distal ends of exposed portions of the plural electronic wires, and a resin fixing step of fixing, while maintaining a state in which the distal ends of the plural electronic wires are parallel aligned, the exposed portions of the plural electronic wires by a resin in a place within a range from an end of the cable sheath to a parallel aligned place.

In the method, in the aligning step, an adhesive tape may be stuck on the plural electronic wires to thereby temporarily hold a wire aligned state of the plural electronic wires.

In the method, an adhesive tape to which a resin is applied may be stuck on the plural electronic wires to thereby temporarily hold a wire aligned state of the plural electronic wires, and the resin may be cured to thereby fix the plural electronic wires in the wire aligned state.

In the method, the multi-core cable may include an overall shield which covers the plural electronic wires inside the cable sheath, and after the electronic wire exposing step, the overall shield may be folded back outwardly of the cable sheath at an end of the cable sheath.

In the method, each of the electronic wires may be a coaxial wire which includes:

the central conductor;

an external conductor arranged outside the central conductor; and the covering, wherein the covering may include:

an inside covering which covers the central conductor; and an outside covering arranged outside the external conductor, in the resin fixing step, portions of the outside coverings of the plural coaxial wires may be fixed by the resin, and after the resin fixing step, the outside coverings of a distal end side beyond a place fixed by the resin may be removed to expose the external conductors, and then, the external conductors of the plural coaxial wires may be mutually fixed by solder.

In the method, the plural electronic wires may be divided into plural groups such that the distal ends of the electronic wires are parallel aligned at a predetermined pitch in an every group and such that the electronic wires are fixed by a resin in an every group.

According to the above-described multi-core cable, the plural electronic wires are fixed by the resin in the vicinity of the end of the cable sheath and in a place which does not range to the distal ends at which the electronic wires are parallel aligned. Since an adhesive force of the resin is strong, a restoring force of the electronic wires can effectively be reduced. As a result, the wire aligned state can effectively be maintained even when the vicinity of the root of the portion of the electronic wires exposed from the cable sheath has the fixed place, or a length of the fixed place is short. Consequently, the central conductors exposed from the multi-core cable can easily be attached to electrodes of the substrate. Also, according to the above-mentioned aligning method for a multi-core cable, the plural electronic wires are fixed by the resin in the vicinity of the end of the cable sheath while maintaining a state in which the plural electronic wires are parallel aligned. As a result, even when a length of the fixed place is short, the wire aligned state of the plural electronic wires can be held and the electronic wires can easily be attached to the substrate.

MODE FOR CARRYING OUT THE INVENTION

An example of an embodiment of an aligning method for a multi-core cable according to the invention will hereinafter be described with reference to the drawings. The multi-core cable can adopt various modes such as the case of connecting both end sides to a substrate or the case of connecting only one end side to a substrate and attaching the other end side to a connector, and in the following multi-core cable, a configuration of one end side will be described.

Figure 1:
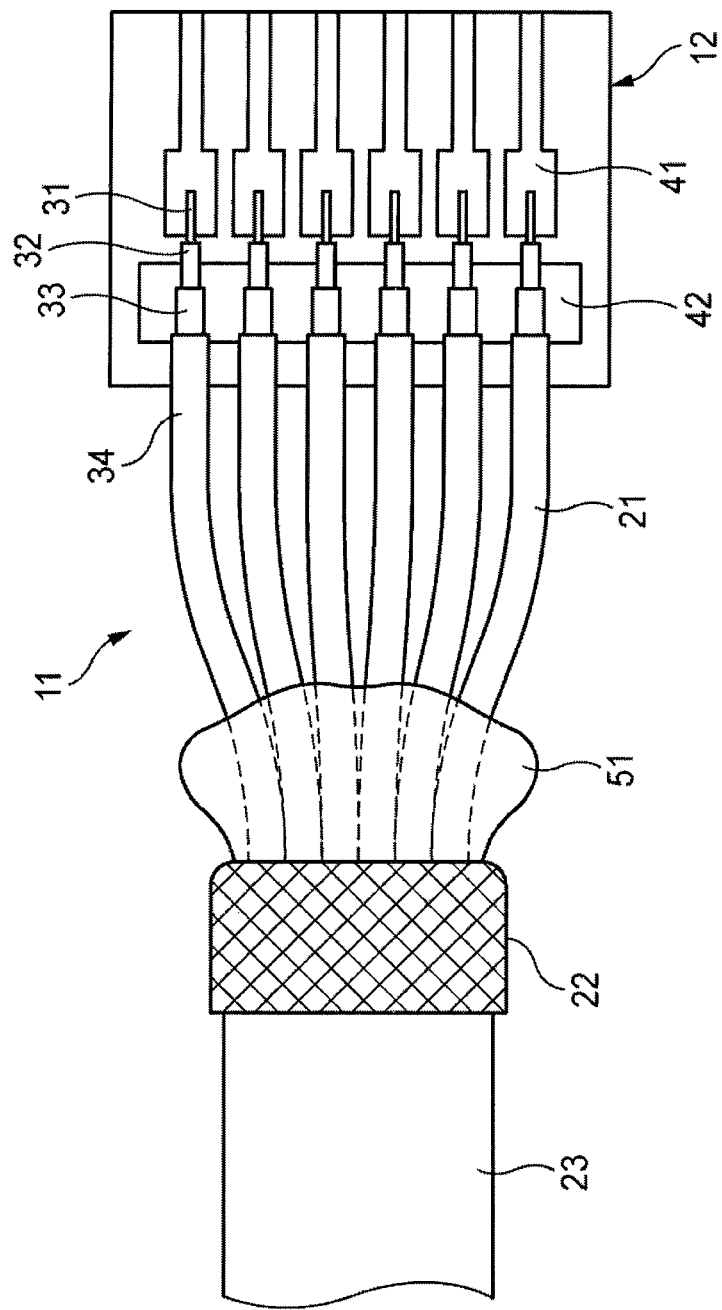
FIG. 1 A plan view in an end of a multi-core cable manufactured by an aligning method for the multi-core cable according to the invention.

As shown in FIG. 1, a multi-core cable 11 is a cable used in connection between, for example, medical devices or information devices, and the end of the multi-core cable is connected to a connector or a substrate 12 arranged inside a probe.

Figure 2:
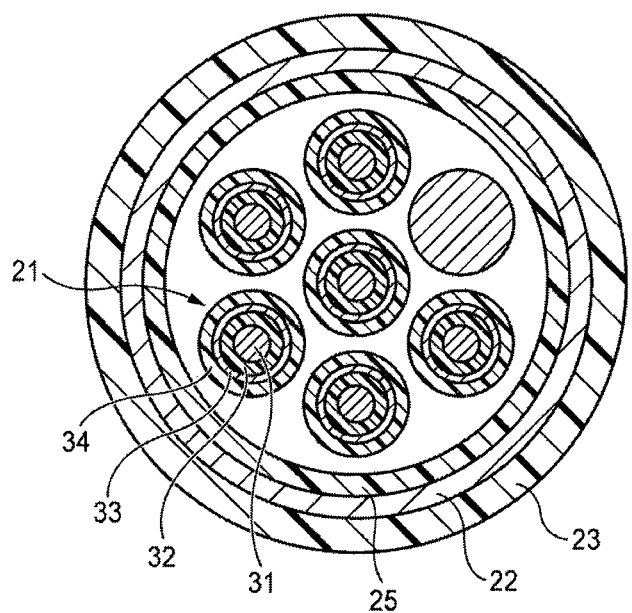
FIG. 2 A transverse sectional view of the multi-core cable.

As shown in FIG. 2, plural coaxial cables (electronic wires) 21 are bundled inside the multi-core cable 11. The periphery of these plural coaxial cables 21 has a shield layer (overall shield) 22 in which copper alloy wires are braided in order to ensure shielding and obtain mechanical reinforcement. The coaxial cables 21 are covered with a cable sheath 23 through this shield layer 22. A wrapping 25 for bundling the plural coaxial cables 21 may be arranged inside the shield layer 22. FIG. 1 shows a state in which the shield layer 22 is folded back.

As the cable sheath 23, a resin with good flexibility, abrasion resistance and mechanical characteristics is used and, for example, fluorine resin, polyvinyl chloride (PVC), urethane, polyolefin, silicone, or polyvinylidene chloride is used.

The coaxial cable 21 has a central conductor 31 in the center, and the periphery of this central conductor 31 sequentially includes an insulator (inside covering) 32, an external conductor 33 and a jacket (outside covering) 34 coaxially.

The central conductor 31 is formed by braiding, for example, plural tin-plated copper wires or copper alloy wires. The insulator 32 is formed by covering the outer periphery of the central conductor 31 with an insulating material made of, for example, polyolefin (polyethylene, foamed polyethylene, etc.), ethylene-vinyl acetate copolymer resin (EVA), ethylene-ethyl acrylate copolymer resin (EEA), vinyl chloride resin (PVC), or fluorine resin.

The external conductor 33 is formed by laterally winding, for example, plural copper alloy wires, and the outer periphery side of this external conductor 33 is covered with the jacket 34 made of resin such as polyester.

In the multi-core cable 11 with the above-described structure, distal end processing of the longitudinal end of the cable is performed, and the plural coaxial cables 21 and the shield layer 22 are stepwise exposed sequentially from the distal end side as shown in FIG. 1.

Distal end processing of each of the coaxial cables 21 is performed, and the central conductor 31, the insulator 32 and the external conductor 33 are respectively stepwise exposed sequentially from the distal end side. The central conductor 31 of each of the coaxial cables 21 is soldered and conductively connected to a signal terminal part 41 including a wiring pattern formed on the substrate 12.

In each of the coaxial cables 21, an exposed position of the external conductor 33 is set in the same position in a length direction, and the external conductors 33 of these coaxial cables 21 are soldered and integrally conductively connected to a ground terminal part 42 including a wiring pattern formed on the substrate 12 over a width direction. Each of the external conductors 33 may be coupled to one ground bar or a set of ground bars and be collectively conducted to the ground terminal part 42 of the substrate 12.

The coaxial cables 21 are parallel aligned at the distal end and are fixed to the substrate 12. The coaxial cables 21 are not completely parallel aligned in the vicinity of the end of the cable sheath 23 on the side nearer than the substrate 12 (the end side of the cable sheath 23), and in this place, a resin 51 is applied to each of the coaxial cables 21 to thereby fix each of the coaxial cables 21. That is, the plural coaxial cables 21 are fixed by the resin 51 in the vicinity of the end of the cable sheath 23.

Next, an aligning method for the multi-core cable 11 connected to the substrate 12 will be described every step.

(Electronic Wire Exposing Step)

Figure 3:
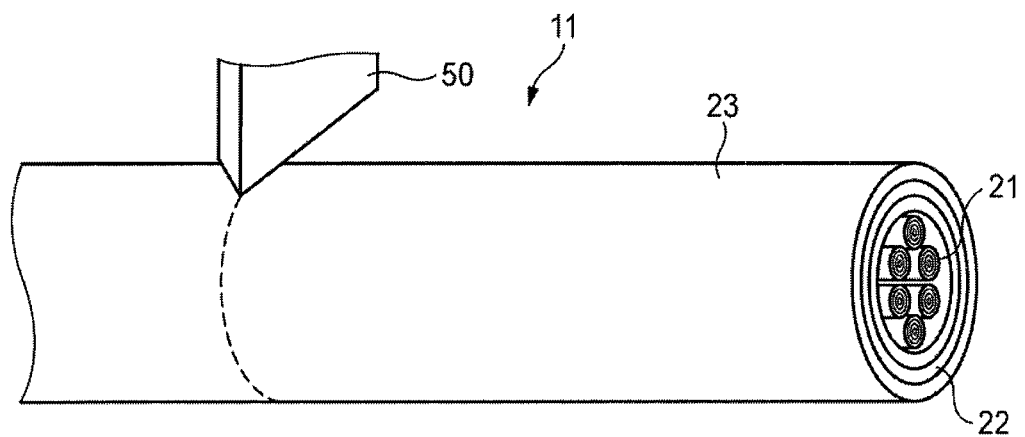
FIG. 3 A perspective view in the end of the multi-core cable showing an electronic wire exposing step of the aligning method for the multi-core cable.
Figure 4:
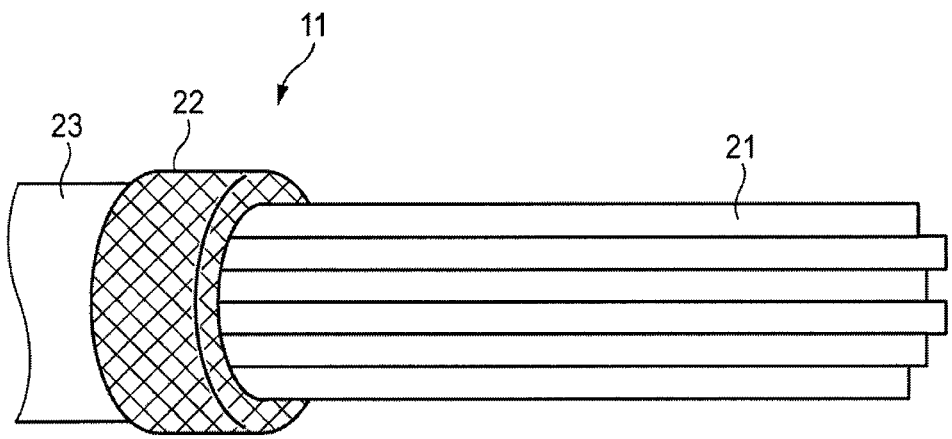
FIG. 4 A perspective view in the end of the multi-core cable showing the electronic wire exposing step of the aligning method for the multi-core cable.

As shown in FIG. 3, the cable sheath 23 is first cut at the end of the multi-core cable 11 by, for example, a cutter 50. Next, by pulling the cable sheath 23 to the end side, the cable sheath 23 is removed and the coaxial cables 21 are exposed by the length (for example, about 40 mm or 50 mm) necessary in the case of performing distal end processing and aligning wires. Also, as shown in FIG. 4, the end of the shield layer 22 is folded back to the outer periphery of the cable sheath 23. The cable sheath 23 may be cut using a $CO_2$ laser etc. instead of the cutter 50.

(Aligning Step)

Figure 5:
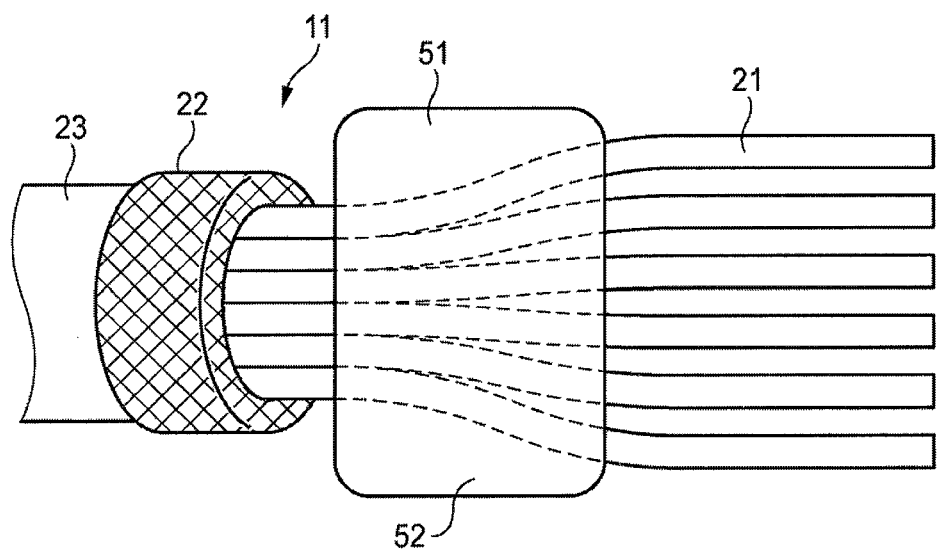
FIG. 5 A perspective view in the end of the multi-core cable showing an aligning step of the aligning method for the multi-core cable.

Then, as shown in FIG. 5, the plural coaxial cables 21 are parallel aligned at the distal end. A pitch between the plural coaxial cables 21 is widened so as to become nearly equal to an arrangement pitch between the signal terminal parts 41 of the substrate 12, and the plural coaxial cables 21 are arranged in a row and are parallel aligned flatly. At this time, the coaxial cables 21 are not completely parallel aligned in the vicinity of the end of the cable sheath 23. Then, a PET (Polyethylene terephthalate) tape 52 to which the resin 51 is applied is stuck on the coaxial cables 21, and a wire aligned state of the coaxial cables 21 is temporarily held. For example, in the coaxial cables 21, the resin 51 is applied within a range from the end of the cable sheath 23 to a place in which the coaxial cables 21 are completely parallel aligned.

(Resin Fixing Step)

Figure 6:
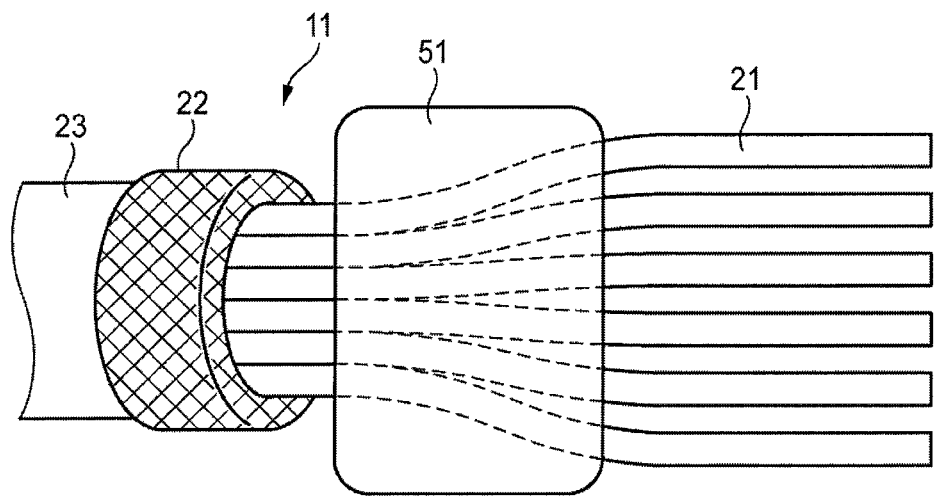
FIG. 6 A perspective view in the end of the multi-core cable showing a resin fixing step of the aligning method for the multi-core cable.

As shown in FIG. 6, the resin 51 applied to the vicinity of the end of the cable sheath 23 is cured and thereafter, the PET tape 52 is peeled. Accordingly, the coaxial cables 21 are fixed with the distal ends of the coaxial cables 21 parallel aligned.

The portion to which the resin 51 is applied is the portion nearer to the end of the cable sheath 23 than the portion in which the coaxial cables 21 are parallel aligned, and is, that is, the portion in which the coaxial cables 21 are almost parallel aligned. A distance between the end of the cable sheath 23 and the end of the fixed place at the distal end side of the coaxial cable 21 is preferably set at 10 mm or less. A length of this fixed place along a longitudinal direction of the coaxial cable 21 is preferably set at 4 to 10 mm.

As the resin 51 for fixing the coaxial cables 21, an ultraviolet curable resin is preferably used and in this case, by spot-irradiating the resin 51 with ultraviolet rays, the resin 51 can be cured in a short time to fix the plural coaxial cables 21. As the resin 51, a thermosetting resin, a thermoplastic resin, etc. also can be used.

(Notch Forming Step)

Figure 7:
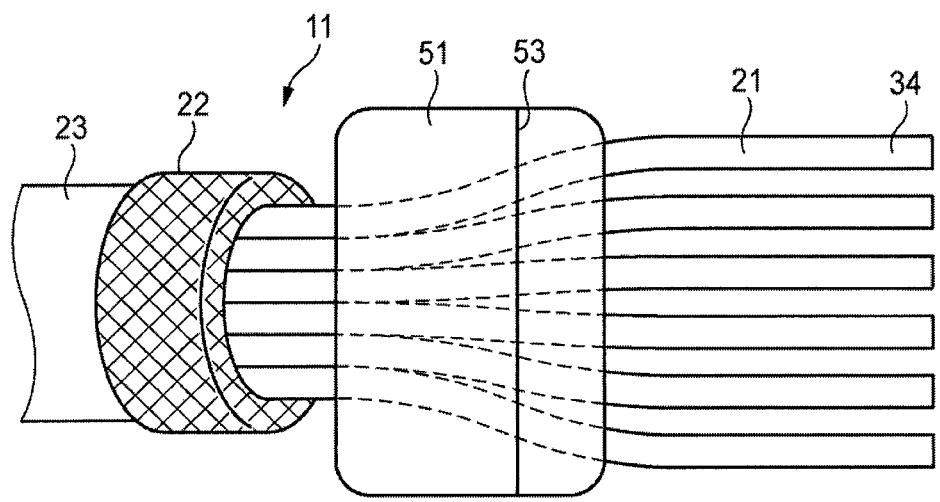
FIG. 7 A perspective view in the end of the multi-core cable showing a notch forming step of the aligning method for the multi-core cable.

As shown in FIG. 7, the jacket 34 of each of the coaxial cables 21 is irradiated with a laser and a notch 53 is formed in the jacket 34. At this time, the notch 53 could be formed in the portion fixed by the resin 51.

Figure 8:
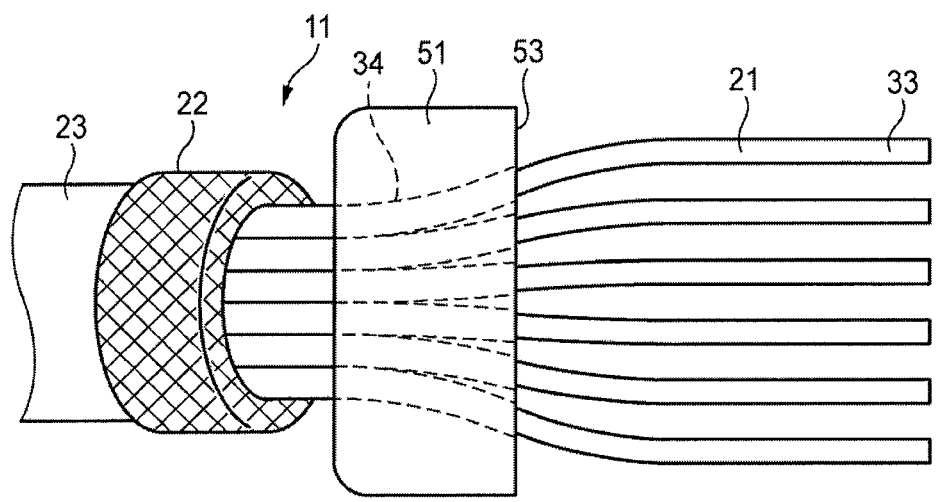
FIG. 8 A perspective view in the end of the multi-core cable showing a stage of exposing external conductors in the aligning method for the multi-core cable.

Subsequently, as shown in FIG. 8, the jacket 34 of the distal end side beyond the notch 53 of the coaxial cables 21 is removed to expose the external conductor 33 of each of the coaxial cables 21. At this time, the jackets 34 of the distal end side can be integrally removed from the notch since the notch 53 is formed in the jackets 34 and the resin 51 for integrating the mutual jackets 34.

Figure 9:
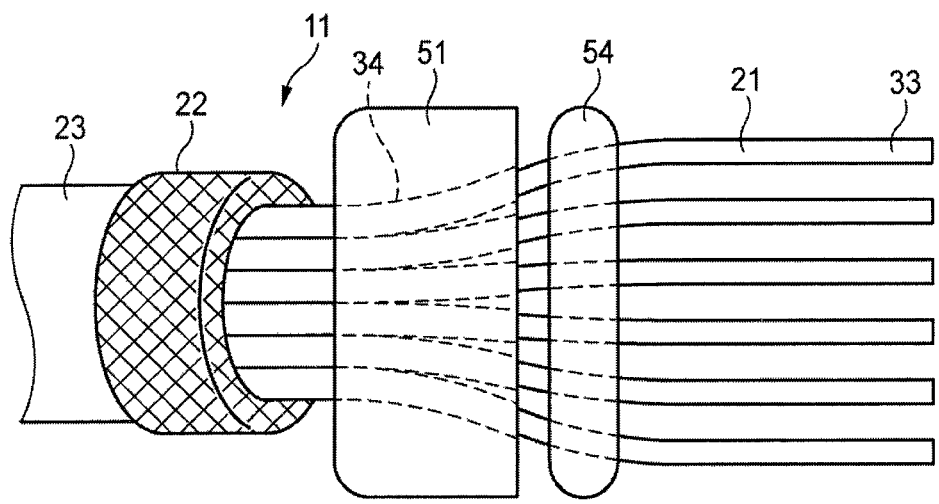
FIG. 9 A perspective view in the end of the multi-core cable showing a stage of coupling the external conductors by solder in the aligning method for the multi-core cable.

Then, as shown in FIG. 9, the adjacent external conductors 33 of the plural coaxial cables 21 are mutually fixed by solder 54. Since a wire aligned state of the plural coaxial cables 21 is maintained by the resin 51, it is easy to collectively fix the plural external conductor 33 by the solder 54. At this time, a ground bar may be fixed by solder across the external conductor 33 of each of the coaxial cables 21.

Figure 10:
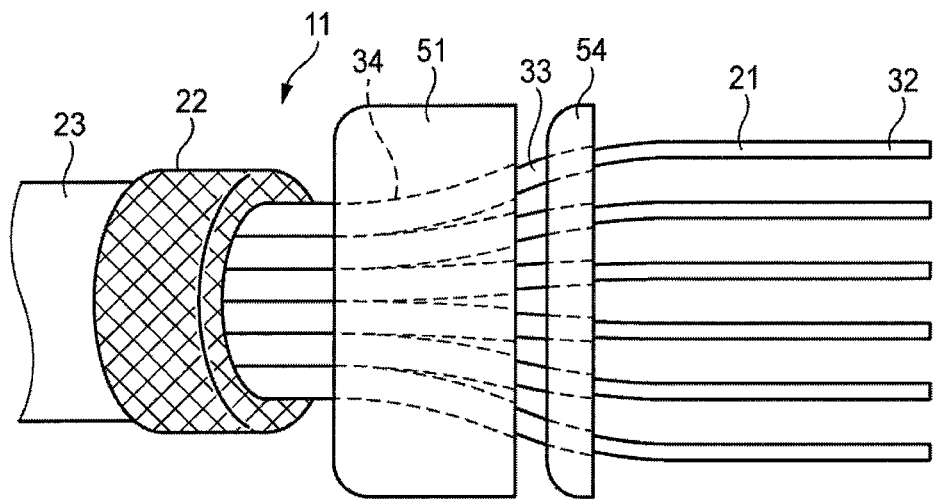
FIG. 10 A perspective view in the end of the multi-core cable showing a stage of exposing inside coverings in the aligning method for the multi-core cable.

Further, as shown in FIG. 10, the solder 54 and the external conductors 33 are cut at the distal end side of the solder 54. Then, the external conductors 33 of the distal end side beyond a cut place are removed to expose the inside coverings 32. Since the plural external conductors 33 are bundled by the solder 54, the solder 54 and the external conductors 33 of the distal end side can be collectively removed from the cut place. A notch could be put linearly along a parallel aligned direction of the coaxial cables 21.

Figure 11:
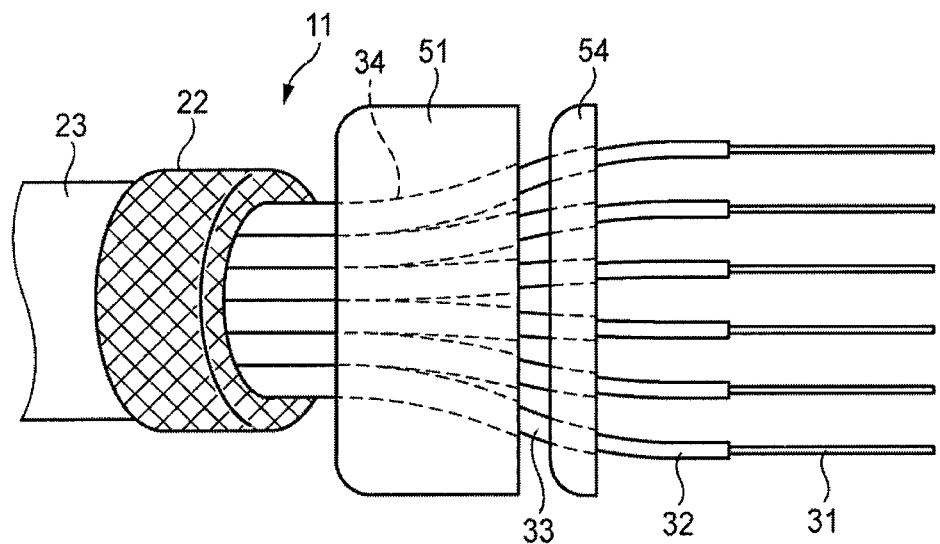
FIG. 11 A perspective view in the end of the multi-core cable showing a central conductor exposing step of the aligning method for the multi-core cable.

Then, as shown in FIG. 11, the exposed inside covering 32 is cut and the inside covering 32 is removed from the distal end side and the central conductor 31 is exposed. In this case, a notch is put in the inside covering 32 by a $CO_2$ laser and the distal end side of each of the coaxial cables 21 can be collectively removed from its notch. The notch could be put linearly along the parallel aligned direction of the coaxial cables 21.

Subsequently, the central conductor 31 of each of the coaxial cables 21 is soldered and conductively connected to the signal terminal part 41 of the substrate 12, and the external conductor 33 is soldered and integrally conductively connected to the ground terminal part 42 of the substrate 12 (see FIG. 1). The resin 51 for fixing the coaxial cables 21 may be peeled from the coaxial cables 21 after the coaxial cables 21 are connected to the substrate 12.

According to the aligning method for the multi-core cable 11 according to the present embodiment thus, in the resin fixing step, the coaxial cables 21 are fixed while maintaining a wire aligned state by the resin 51. This resin 51 can effectively maintain the wire aligned state even when a length of the fixed place is short since the vicinities of the roots of exposed portions of the coaxial cables 21 (the vicinity of a cut portion of the cable sheath 23 in the coaxial cables 21) are fixed. Since the coaxial cables 21 are bundled by mutually fixing the external conductors 33 by the solder 54, the central conductors 31 can be collectively exposed. The external conductors 33 bundled by the solder 54 can be collectively connected to the ground terminal part 52 of the substrate 12.

Here, the plural coaxial cables 21 are bundled inside the multi-core cable 11 as shown in FIG. 2. In the vicinity of the cut portion of the cable sheath 23, a restoring force by which the coaxial cables 21 return to a state as shown in FIG. 2 is strong. When the coaxial cables 21 are fixed by a tape unlike the above-described embodiment, it is necessary to stick the tape on a place in which a pitch between the plural coaxial cables 21 is widened so as to match with an arrangement pitch between the signal terminal parts 41, that is, a place distant from the end of the cable sheath 23. This is because it is difficult to maintain a wire aligned state (a state separated at a predetermined pitch) of the coaxial cables 21 by an adhesive force of the tape even when the tape is stuck on the vicinity of the cut portion of the cable sheath 23. Consequently, in the case of using the tape, a length exposed from the cut portion of the cable sheath 23 of the coaxial cables 21 (a length from the cut portion of the cable sheath 23 to the distal end of the central conductor 31) becomes long.

However, according to the aligning method for the multi-core cable 11 according to the present embodiment, the resin 51 is applied and cured to a place (the vicinity of the root of the portion exposed from the cable sheath 23 in the coaxial cables 21) before a pitch between the coaxial cables 21 matches with a predetermined pitch between the signal terminal parts 41. Consequently, even in a state in which each of the coaxial cables 21 is not completely parallel aligned and overlaps slightly, the coaxial cables 21 can be fixed while fixing an arrangement state of each of the coaxial cables 21, that is, maintaining a wire aligned state. As a result, work of connection between the coaxial cables 21 and the substrate 12 is facilitated.

The resin 51 has only to be attached to the vicinity of the root of the portion exposed from the cable sheath 23 of the coaxial cables 21, and it is unnecessary to lengthen an exposed length to alignment of the coaxial cables 21 as compared with the case of holding a wire aligned state by the tape. As a result, the exposed length of the coaxial cables 21 can be shortened.

According to the invention, since a distance from the cut portion of the cable sheath 23 to the substrate 12 can be shortened, it is unnecessary to arrange a pitch maintaining component such as a comber board between the coaxial cables 21, and the multi-core cable 11 can be connected to the substrate 12 at low cost.

In the aligning step, the PET tape 52 is stuck on the coaxial cables 21 and a wire aligned state of the coaxial cables 21 is temporarily held. In the subsequent resin fixing step, a resin may be applied to a place in which the tape is not stuck. When a resin for fixing is applied to the tape, temporary fixing of the tape and application of the resin can be implemented simultaneously.

In order to ensure workability of distal end processing and shorten the exposed length of the coaxial cables 21 without cutting the cable sheath 23, in some cases, the cable sheath 23 is slid to the shield layer 22 and work of connection to the substrate 12 or lead-out processing of the distal end is completed and the cable sheath 23 is again returned. However, in order to enable the cable sheath 23 to be slid to the shield layer 22 in this manner, for example, it is necessary to form the cable sheath 23 by PVC with low adhesion to the shield layer 22, and materials used in the cable sheath 23 are limited.

For example, when the cable sheath 23 is formed on the shield layer 22 using fluorine resin, urethane resin or halogen-free material, adhesion between such materials and the shield layer 22 is high, with the result that the cable sheath 23 cannot be slid to the shield layer 22. In such a case, it is difficult to do work of connection of the distal end unless the exposed length of the coaxial cables 21 is lengthened.

However, according to the aligning method for the multi-core cable 11 according to the present embodiment, even when the cable sheath 23 is formed by fluorine resin, urethane resin or halogen-free material, work of connection can easily be done while shortening the exposed length.

When the cable is frequently bent in the case of tending to slide the cable sheath 23 to the shield layer 22, the cable sheath 23 may be longitudinally slid to expose the electronic wires such as the coaxial cables 21 in the vicinity of the substrate 12. In that case, arrangement of the electronic wires of the inside of the cable sheath 23 may be disordered to worsen mechanical characteristics such as durability of the cable. Sliding of the cable sheath 23 is undesirable from such a standpoint. Consequently, according to the aligning method for the multi-core cable 11 according to the present embodiment, work of connection can easily be done in the short exposed length while preventing the cable sheath 23 from being slid to the shield layer 22 by using fluorine resin, urethane resin or halogen-free material as described above.

Although the embodiment illustrates the example in which the resin 51 is attached to the coaxial cables 21 by sticking the PET tape 52 to which the resin 51 is applied, the resin 51 may be directly attached to the coaxial cables 21. The resin 51 may be attached while temporarily maintaining a wire aligned state of the coaxial cables 21 by sticking the PET tape 52. Tapes other than the PET tape can be adopted as an adhesive tape.

Although the embodiment illustrates the example in which the notch 53 is formed in the portion to which the resin 51 is attached, the invention is not limited to this example. The notch 53 may be formed in the portion other than the cured resin 51. In any case, it is easy to collectively expose the plural central conductors 31 since the coaxial cables 21 are bundled by the resin 51.

Although the embodiment illustrates the example in which the multi-core cable 11 includes the coaxial cables 21 having the insulators 32 and the external conductors 33, the invention can also be applied to the multi-core cable 11 including an insulated wire in which the central conductor 31 is covered with the jacket 34. Or, the invention can also be applied to a multi-core cable including both of the coaxial cable 21 and the insulated wire. In the insulated wire, a covering of the portion of the distal end side beyond the portion hardened by the resin could be removed to expose the central conductor. When the coaxial cable 21 and the insulated wire are mixed, the covered portion of the insulated wire is parallel aligned with the exposed portion of the external conductor 31 of the coaxial cable 21. Places in which notches are put in the coverings (the inside covering 32 in the coaxial cable 21) of the coaxial cable 21 and the insulated wire are the same place in a length direction, and the coverings are collectively removed to expose their central conductors.

The multi-core cable of the invention can also be applied to uses other than the application as described above.

Figure 12:
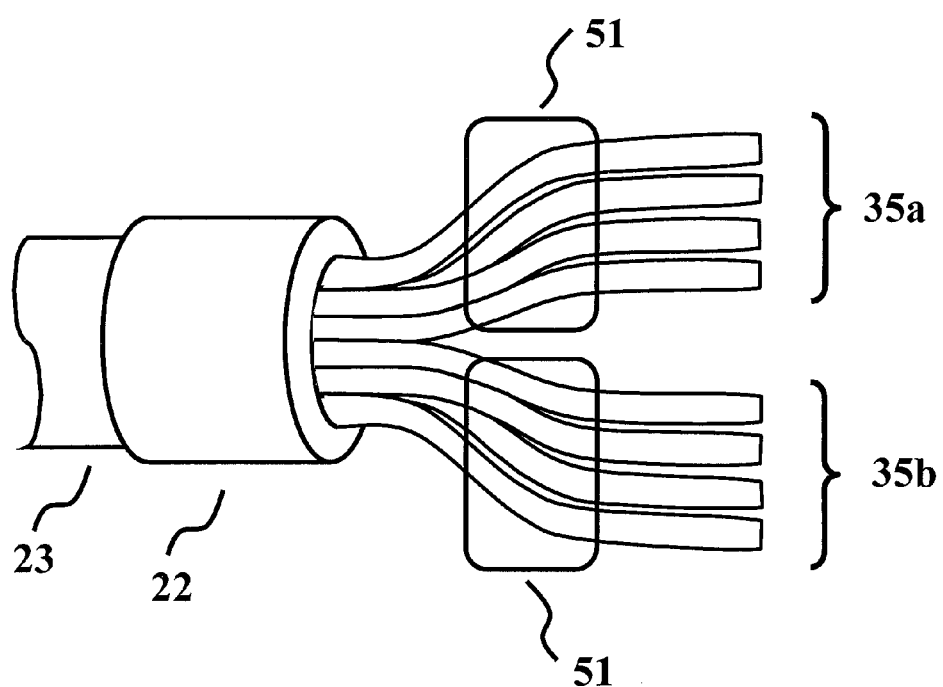
FIG. 12 A view showing another example of the resin fixing step of the aligning method for the multi-core cable.

In the embodiment, the electronic wires made of the coaxial cables 21 are arranged in a row and are fixed by the resin 51. However, a wire aligned state of the electronic wires fixed by the resin 51 is not limited to arrangement of one row, and may be various wire aligned states according to wiring. For example, as shown in FIG. 12, plural electronic wires may be fixed by the resin 51 in every group 35a, 35b with the electronic wires divided into upper and lower groups 35a, 35b. The plural electronic wires may be twisted 180° around an axis coinciding with a longitudinal direction of the electronic wires and be fixed by the resin 51.

DESCRIPTION OF REFERENCE NUMERALS AND SIGNS

11: multi-core cable
12: substrate
21: coaxial cable (electronic wire)
22: shield layer (overall shield)
23: cable sheath
31: central conductor
32: insulator (inside covering)
33: external conductor
34: jacket (outside covering)
51: resin
52: adhesive tape
54: solder

The invention claimed is:
1. A multi-core cable in which a cable sheath covers plural electronic wires in each of which a central conductor is covered with a covering,
the electronic wires being exposed from a longitudinal end of the cable sheath,
distal ends of exposed portions of the plural electronic wires being parallel aligned, the exposed portions of the plural electronic wires being fixed by a resin at a resin fixed place where the electronic wires are not completely parallel aligned;

a distance between the longitudinal end of the cable sheath and an end of the resin fixed place at a side of the distal ends of the electronic wires being set at 10 mm or less; and the resin being an ultraviolet curable resin, a thermosetting resin or a thermoplastic resin.

2. The multi-core cable of claim 1, wherein each of the electronic wires is a coaxial wire which includes:
the central conductor;
an external conductor arranged outside the central conductor; and
the covering.

3. The multi-core cable of claim 2, wherein
the external conductors of the coaxial wires are mutually coupled and fixed by solder.

4. The multi-core cable of claim 3, wherein
a portions of each of the external conductors of each of the coaxial wires remains exposed between the resin fixed place and the solder.

5. The multi-core cable of claim 1, wherein
each of the electronic wires is an insulated wire.

6. The multi-core cable of claim 1, wherein
a coaxial wire and an insulated wire are mixed as the plural electronic wires.

7. The multi-core cable of claim 1, wherein
the plural electronic wires are divided into plural groups such that the distal ends of the electronic wires are parallel aligned at a predetermined pitch in every group and such that the electronic wires are fixed by the resin in every group.

8. The multi-core cable of claim 1, wherein
a length of the fixed place along a longitudinal direction of the electronic wire is set at 4 to 10 mm.

9. The multi-core cable of claim 1, wherein
respective distances between adjacent ones of the electronic wires is less at the resin fixed place than at the distal ends of the adjacent ones of the electronic wires.

10. The multi-core cable of claim 1, wherein
the resin covers a portion of the covering of each of the electronic wires at the resin fixed place.

11. The multi-core cable of claim 1, wherein
the resin at the resin fixed place is spaced apart from the longitudinal end of the cable sheath.

12. The multi-core cable of claim 1, wherein
the resin at the resin fixed place is spaced apart from the longitudinal end of the cable sheath by a shield layer which is part of the multi-core cable.

13. The multi-core cable of claim 12, wherein
the resin at the resin fixed place contacts the shield layer.

14. An aligning method for a multi-core cable including: plural electronic wires in each of which a central conductor is covered with a covering; and a cable sheath which covers the electronic wires, the method including:
an electronic wire exposing step of removing the cable sheath at an end of the multi-core cable and exposing the plural electronic wires at a longitudinal end of the cable sheath;

an aligning step of parallel aligning distal ends of exposed portions of the plural electronic wires; and a resin fixing step of fixing, while maintaining a state in which the distal ends of the plural electronic wires are parallel aligned, the exposed portions of the plural electronic wires by a resin, which is an ultraviolet curable resin, a thermosetting resin or a thermoplastic resin, at a resin fixed place where the electronic wires are not completely parallel aligned and a distance between the longitudinal end of the cable sheath and an end of the resin fixed place at a side of the distal ends of the electronic wires being set at 10 mm or less.

15. The method of claim 14, wherein in the aligning step, an adhesive tape is stuck on the plural electronic wires to thereby temporarily hold a wire aligned state of the plural electronic wires.

16. The method of claim 14, wherein an adhesive tape to which a resin is applied is stuck on the plural electronic wires to thereby temporarily hold a wire aligned state of the plural electronic wires, and the resin is cured to thereby fix the plural electronic wires in the wire aligned state.

17. The method of claim 14, wherein the multi-core cable includes an overall shield which covers the plural electronic wires inside the cable sheath, and wherein, after the electronic wire exposing step, the overall shield is folded back outwardly of the cable sheath at an end of the cable sheath.

18. The method of claim 14, wherein each of the electronic wires is a coaxial wire which includes:
the central conductor;
an external conductor arranged outside the central conductor; and
the covering,
wherein the covering includes:
an inside covering which covers the central conductor; and
an outside covering arranged outside the external conductor,
wherein, in the resin fixing step, portions of the outside coverings of the plural coaxial wires are fixed by the resin, and
wherein, after the resin fixing step, the outside coverings of a distal end side beyond a place fixed by the resin are removed to expose the external conductors, and then, the external conductors of the plural coaxial wires are mutually fixed by solder.

19. The method of claim 14, wherein the plural electronic wires are divided into plural groups such that the distal ends of the electronic wires are parallel aligned at a predetermined pitch in an every group and such that the electronic wires are fixed by a resin in an every group.

* * * * *